(12) United States Patent
Nakamura et al.

(10) Patent No.: US 11,047,792 B2
(45) Date of Patent: Jun. 29, 2021

(54) SEMICONDUCTOR DEVICE INSPECTION METHOD AND SEMICONDUCTOR DEVICE INSPECTION APPARATUS

(71) Applicant: HAMAMATSU PHOTONICS K.K., Hamamatsu (JP)

(72) Inventors: Tomonori Nakamura, Hamamatsu (JP); Akihiro Otaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 151 days.

(21) Appl. No.: 16/336,238

(22) PCT Filed: Jul. 4, 2017

(86) PCT No.: PCT/JP2017/024519
§ 371 (c)(1),
(2) Date: Mar. 25, 2019

(87) PCT Pub. No.: WO2018/061378
PCT Pub. Date: Apr. 5, 2018

(65) Prior Publication Data
US 2019/0212252 A1 Jul. 11, 2019

(30) Foreign Application Priority Data

Sep. 28, 2016 (JP) .............................. JP2016-189784

(51) Int. Cl.
*G06K 9/00* (2006.01)
*G01N 21/17* (2006.01)
(Continued)

(52) U.S. Cl.
CPC ......... *G01N 21/1717* (2013.01); *G01N 21/00* (2013.01); *G01N 21/17* (2013.01);
(Continued)

(58) Field of Classification Search
CPC .... G01N 21/1717; G01N 21/00; G01N 21/17; G01R 31/302; G01R 31/311; H01L 22/10
(Continued)

(56) References Cited

U.S. PATENT DOCUMENTS 6,057,677 A 5/2000 Wakana et al.
9,588,175 B2 3/2017 Nakamura

FOREIGN PATENT DOCUMENTS

JP 2007-64975 A 3/2007
JP 2009-541728 A 11/2009
(Continued)

OTHER PUBLICATIONS

International Preliminary Report on Patentability dated Apr. 11, 2019 for PCT/JP2017/024519.

*Primary Examiner* — Stephen P Coleman
(74) *Attorney, Agent, or Firm* — Faegre Drinker Biddle & Reath LLP

(57) ABSTRACT

A semiconductor device inspection method of inspecting a semiconductor device which is an inspection object includes: a step of inputting a stimulation signal to the semiconductor device; a step of acquiring a detection signal based on a reaction of the semiconductor device to which the stimulation signal has been input; a step of generating a first in-phase image and a first quadrature image including amplitude information and phase information in the detection signal based on the detection signal and a reference signal generated based on the stimulation signal; and a step of performing, a filtering process of reducing noise on at least one of the first in-phase image and the first quadrature image and then generating a first amplitude image based on the first in-phase image and the first quadrature image.

17 Claims, 11 Drawing Sheets

(51) Int. Cl.
  *H01L 21/66* (2006.01)
  *G01R 31/311* (2006.01)
  *G01R 31/302* (2006.01)
  *G01N 21/00* (2006.01)

(52) U.S. Cl.
  CPC .......... *G01R 31/302* (2013.01); *G01R 31/311* (2013.01); *H01L 22/10* (2013.01)

(58) Field of Classification Search
  USPC ........................................................ 382/145
  See application file for complete search history.

(56) References Cited

FOREIGN PATENT DOCUMENTS

| | | | | |
|---|---|---|---|---|
| JP | 2010-271307 | A | 12/2010 | |
| JP | 2015-145883 | A | 8/2015 | |
| WO | WO-2007/147968 | A2 | 12/2007 | |
| WO | WO-2016/129458 | A1 | 8/2016 | |
| WO | WO-2016129458 | A1 * | 8/2016 | ............. G02B 27/62 |

\* cited by examiner

Fig. 8
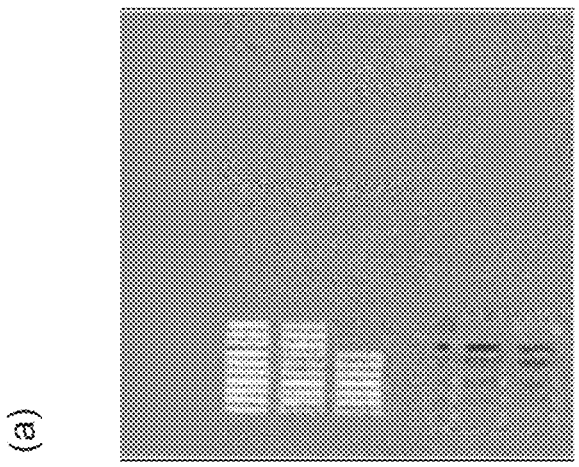
(c)
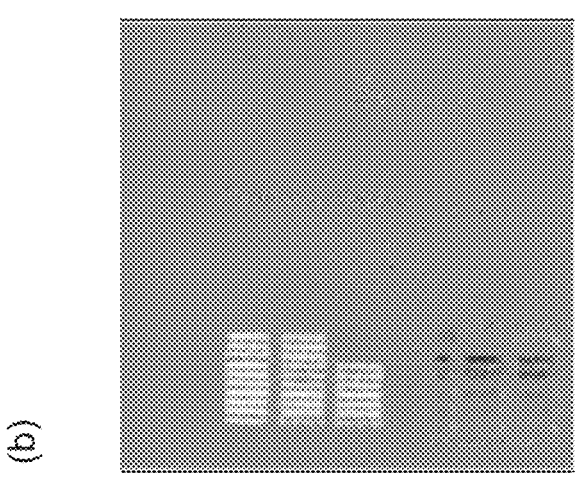
(b)
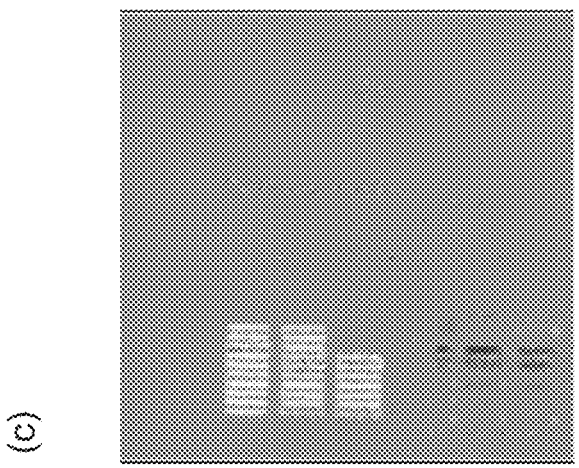
(a)

Fig.9
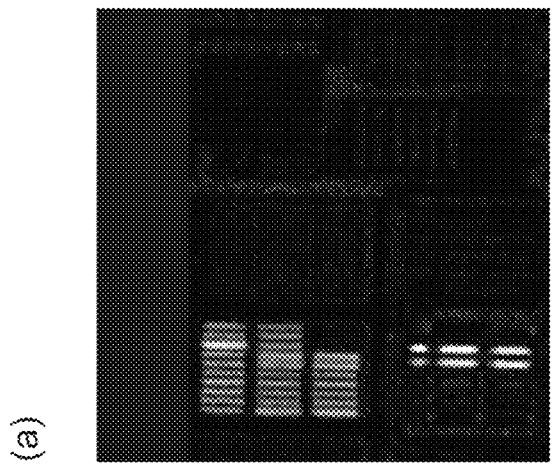
(a)
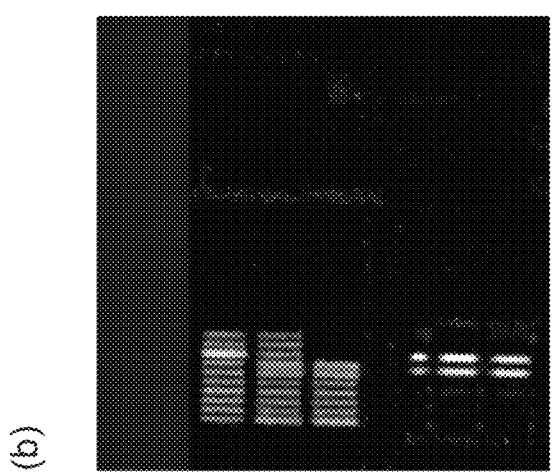
(b)
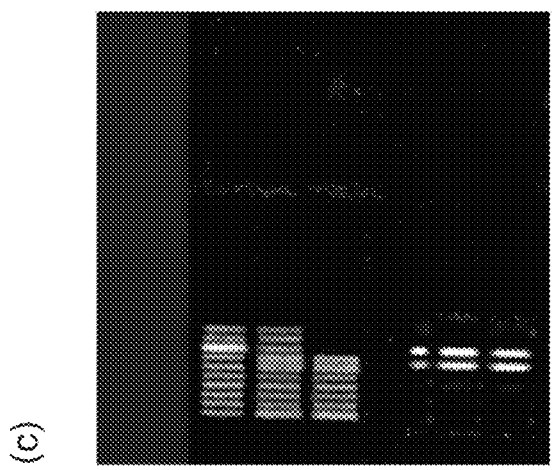
(c)

Fig. 10
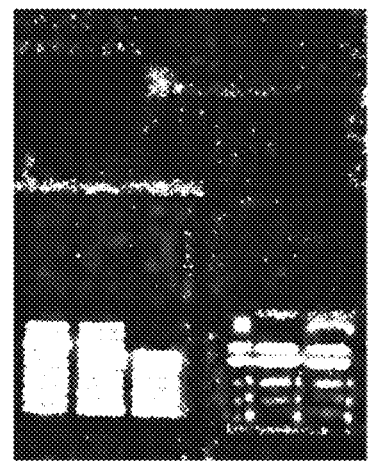
(c)
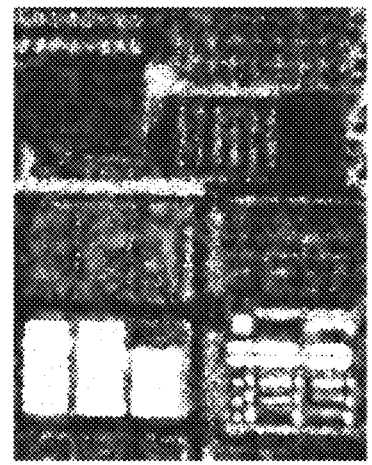
(b)
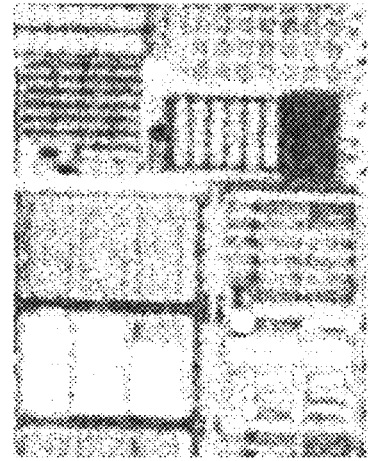
(a)

SEMICONDUCTOR DEVICE INSPECTION METHOD AND SEMICONDUCTOR DEVICE INSPECTION APPARATUS

TECHNICAL FIELD

The present disclosure relates to a semiconductor device inspection method and a semiconductor device inspection apparatus.

BACKGROUND ART

In the related art, an optical probing technique which is used for inspection of an integrated circuit is known. In such an optical probing technique, an integrated circuit is irradiated with light emitted from a light source, reflected light reflected by the integrated circuit is detected by an optical sensor, and a detection signal is acquired. A target frequency is selected in the acquired detection signal, and amplitude energy thereof is displayed with elapse of time or is displayed as a two-dimensional mapping such as an amplitude or a phase. Accordingly, a position on a circuit which operates at a target frequency can be identified.

CITATION LIST

Patent Literature

Patent Literature 1: Japanese Unexamined Patent Publication No. 2010-271307

SUMMARY OF INVENTION

Technical Problem

The above-mentioned optical probing technique is a very effective technique that can allow a position of a fault and a cause of a fault in a semiconductor device such as an integrated circuit to be identified. However, when a detection signal is acquired, noise due to a light source or a system may be superimposed on the measurement results and the amplitude in an area originally without a signal may not be 0 (zero). For example, in electro-optical frequency mapping (EOFM) which is an optical probing technique, even if noise due to a light source is removed, shot noise dependent on the number of photons necessarily remains. Accordingly, a noise component which is proportional to a square root of a light intensity is superimposed on the measurement results.

An object of the present disclosure is to provide a semiconductor device inspection method and a semiconductor device inspection apparatus that can accurately perform inspection of a semiconductor device.

Solution to Problem

According to an aspect, there is provided a semiconductor device inspection method of inspecting a semiconductor device which is an inspection object, including: a step of inputting a stimulation signal to the semiconductor device; a step of acquiring a detection signal based on a reaction of the semiconductor device to which the stimulation signal has been input; a step of generating a first in-phase image and a first quadrature image including amplitude information and phase information in the detection signal based on the detection signal and a reference signal generated based on the stimulation signal; and a step of performing a filtering process of reducing noise on at least one of the first in-phase image and the first quadrature image and then generating a first amplitude image based on the first in-phase image and the first quadrature image.

In this semiconductor device inspection method, the first amplitude image is generated based on the first in-phase image and the first quadrature image including amplitude information and phase information of a detection signal. The phase information has a random value in an area in which a reaction to a stimulation signal cannot be acquired. The first in-phase image and the first quadrature image including the phase information have a random value in an area in which a reaction to a stimulation signal cannot be acquired. Accordingly, a first amplitude image in which noise has been effectively reduced can be acquired by performing a filtering process on at least one of the first in-phase image and the first quadrature image. Accordingly, it is possible to accurately inspect a semiconductor device.

In the aspect, the semiconductor device inspection method may further include: a step of generating a phase image based on the first in-phase image and the first quadrature image; a step of generating a second in-phase image and a second quadrature image based on the first amplitude image and the phase image; and a step of performing a filtering process of reducing noise on at least one of the second in-phase image and the second quadrature image and then generating a second amplitude image based on the second in-phase image and the second quadrature image. According to this configuration, a second amplitude image in which noise has been more effectively reduced can be acquired by further performing a filtering process on the first amplitude image which is generated by performing the filtering process thereon.

In the aspect, the semiconductor device inspection method may further include a step of causing the first in-phase image and the first quadrature image to be offset such that an average value of signal intensities of the first in-phase image and the first quadrature image in a background area in which the detection signal was not originally detected is 0, and the step of generating the first amplitude image may include performing the filtering process on at least one of the first in-phase image and the first quadrature image which have been offset. According to this configuration, an amplitude image in which a noise component due to a reference signal has been reduced can be generated.

In the aspect, the semiconductor device inspection method may further include: a step of causing the first in-phase image and the first quadrature image to be offset such that an average value of signal intensities of the first in-phase image and the first quadrature image in a background area in which the detection signal was not originally detected is 0; a step of generating a phase image based on the first in-phase image and the first quadrature image which have been offset; a step of generating a second in-phase image and a second quadrature image based on the first amplitude image and the phase image; and a step of performing a filtering process of reducing noise on at least one of the second in-phase image and the second quadrature image and then generating a second amplitude image based on the second in-phase image and the second quadrature image. According to this configuration, a phase image in which a noise component due to a reference signal has been reduced can be generated and a second amplitude image in which noise has been more effectively reduced can be acquired.

In the aspect, a filter which is used in the filtering process may be one of a median filter, a nonlocal averaging filter, and a frequency filter. According to this configuration, it is possible to easily implement the filtering process.

According to another aspect, there is provided a semiconductor device inspection apparatus for inspecting a semiconductor device in a state in which a stimulation signal has been input to the semiconductor device which is an inspection object, including: a detector for detecting a reaction of the semiconductor device to which the stimulation signal has been input and outputs a detection signal; and an image processing unit for generating a first in-phase image and a first quadrature image including amplitude information and phase information in the detection signal based on the detection signal and a reference signal generated based on the stimulation signal, performs a filtering process of reducing noise on at least one of the first in-phase image and the first quadrature image, and then generates a first amplitude image based on the first in-phase image and the first quadrature image.

In this semiconductor device inspection apparatus, the image processing unit generates the first amplitude image based on the first in-phase image and the first quadrature image including amplitude information and phase information of a detection signal. Here, since the phase information has a random value in an area in which a reaction to a stimulation signal cannot be acquired, the first in-phase image and the first quadrature image including the phase information also have a random value in an area in which a reaction to a stimulation signal cannot be acquired. Accordingly, a first amplitude image in which noise has been effectively reduced can be acquired by performing a filtering process on at least one of the first in-phase image and the first quadrature image. Accordingly, it is possible to accurately inspect a semiconductor device.

In the aspect, the image processing unit may generate a phase image based on the first in-phase image and the first quadrature image, generate a second in-phase image and a second quadrature image based on the first amplitude image and the phase image, perform a filtering process on at least one of the second in-phase image and the second quadrature image, and then generate a second amplitude image based on the second in-phase image and the second quadrature image. According to this configuration, a second amplitude image in which noise has been more effectively reduced can be acquired by further performing a filtering process on the first amplitude image which is generated by performing the filtering process thereon.

In the aspect, the image processing unit may cause the first in-phase image and the first quadrature image to be offset such that an average value of signal intensities in a background area in which the detection signal was not originally detected is 0 and perform the filtering process on at least one of the first in-phase image and the first quadrature image which have been offset. According to this configuration, an amplitude image in which a noise component due to a reference signal has been reduced can be generated.

In the aspect, the image processing unit may cause the first in-phase image and the first quadrature image to be offset such that an average value of signal intensities in a background area in which the detection signal was not originally detected is 0 and generate a phase image based on the first in-phase image and the first quadrature image which have been offset. According to this configuration, a phase image in which a noise component due to a reference signal has been reduced can be generated.

In the aspect, the image processing unit may include an analysis unit for generating in-phase information and quadrature information based on the detection signal and the reference signal and a calculation unit for generating the first in-phase image and the first quadrature image based on the in-phase information and the quadrature information. According to this configuration, it is possible to reduce a processing load in the analysis unit.

In the aspect, the image processing unit may include an analysis unit for generating the amplitude information and the phase information based on the detection signal and the reference signal and a calculation unit for generating the first in-phase image and the first quadrature image based on the amplitude information and the phase information. According to this configuration, it is possible to reduce a processing load in the calculation unit.

In the aspect, the analysis unit may be one of a lock-in amplifier, a spectrum analyzer, and a network analyzer. According to this configuration, it is possible to easily implement the analysis unit.

In the aspect, the semiconductor device inspection apparatus may further include: a light source for irradiating the semiconductor device with light; and a scanning unit for scanning the semiconductor device with the light, and the detector may detect change in intensity of reflected light of the light as a reaction of the semiconductor device to which the stimulation signal has been input.

In the aspect, the semiconductor device inspection apparatus may further include a magneto-optical crystal disposed to face the semiconductor device in an optical path of the light.

Effects of Invention

With the semiconductor device inspection method and the semiconductor device inspection apparatus according to one aspect, it is possible to accurately perform inspection of a semiconductor device by reducing noise.

BRIEF DESCRIPTION OF DRAWINGS

FIG. 8 is a diagram illustrating an example of an quadrature image in which noise has been reduced.

FIG. 9 is a diagram illustrating an example of an amplitude image (not enhanced) in which noise has been reduced.

FIG. 10 is a diagram illustrating an example of an amplitude image (enhanced) in which noise has been reduced.

DESCRIPTION OF EMBODIMENTS

Hereinafter, embodiments will be specifically described with reference to the accompanying drawings. For the purpose of convenience, elements which are substantially the same will be referred to by the same reference signs and description thereof will not be repeated.

First Embodiment

Figure 1:
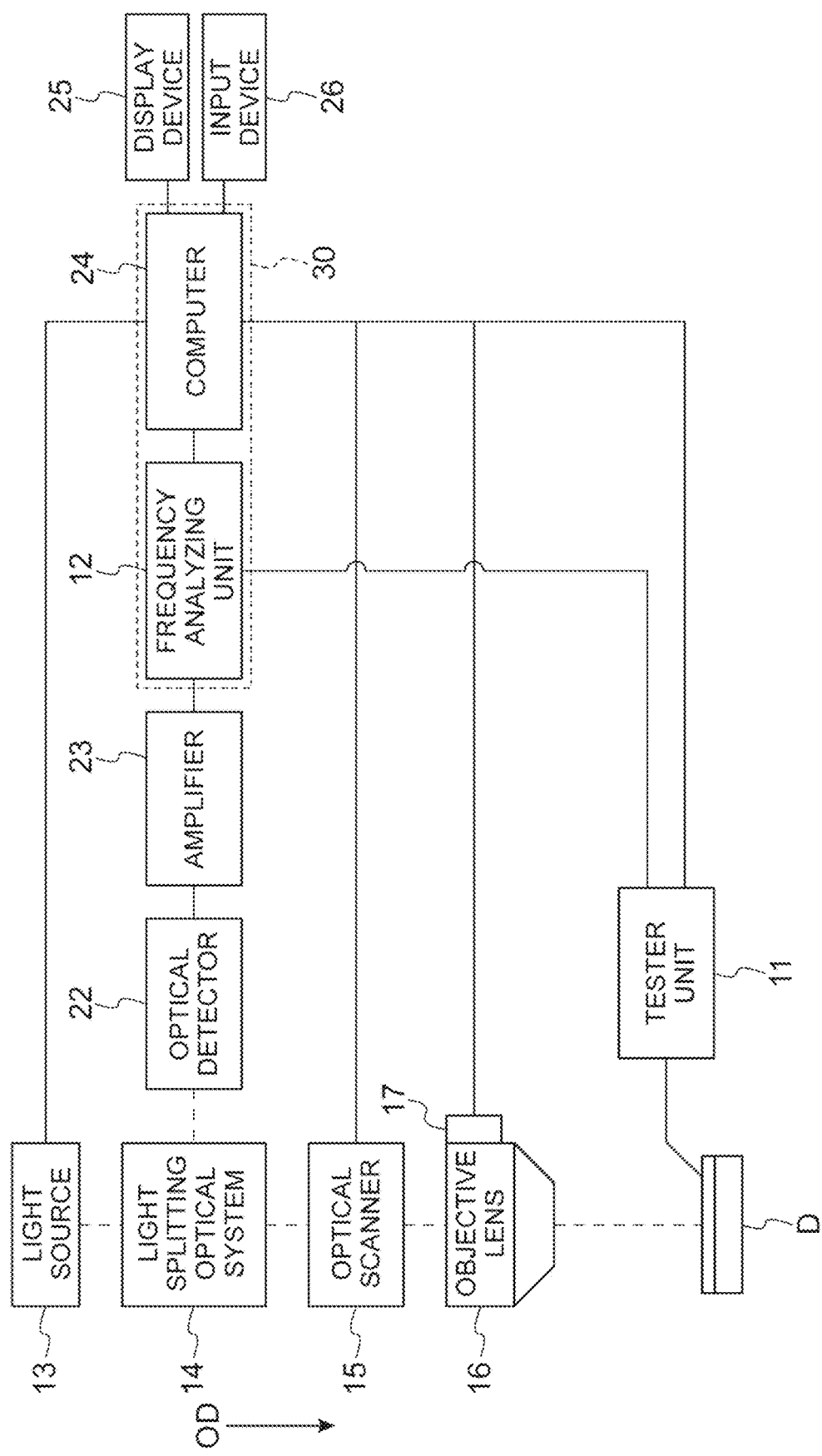
FIG. 1 is a diagram illustrating a configuration of an inspection apparatus according to a first embodiment.

As illustrated in FIG. 1, a semiconductor device inspection apparatus 1 according to a first embodiment can be used to inspect a semiconductor device D, for example, by identifying a position at which an abnormality has occurred in the semiconductor device D which is an inspection object. Examples of the semiconductor device D include integrated circuits having a PN junction such as a transistor (for example, a small-scale integration (SSI) circuit, a medium-scale integration (MSI) circuit, a large-scale integration (LSI) circuit, a very-large-scale integration (VLSI) circuit, an ultra-large-scale integration (VLSI) circuit, and a giga-scale integration (GSI) circuit), MOS transistors and bipolar transistors for large current/high voltage, and a power semiconductor device (a power device). The semiconductor device D may be a package including a semiconductor device, a composite substrate, or the like.

A tester unit 11 is electrically connected to the semiconductor device D via a device control cable. The tester unit 11 is operated with a power supply (not illustrated) and applies a predetermined modulated current signal (a stimulation signal) to the semiconductor device D. The semiconductor device inspection apparatus 1 may perform lock-in detection by generating light corresponding to a detection frequency from a light source 13 (which will be described later) while applying the modulated current signal from the tester unit 11 to the semiconductor device D. In this case, an S/N ratio can be improved. The tester unit 11 is electrically connected to a frequency analyzing unit 12 via a timing signal cable. A modulated voltage signal may be applied as the stimulation signal. A pulse generator or the like may be used as a signal applying unit instead of the tester unit.

The semiconductor device inspection apparatus 1 includes a light source 13 that is operated with a power supply (not illustrated). The light source 13 generates and outputs CW light or pulse light with which the semiconductor device D is irradiated. Light output from the light source 13 may be incoherent (non-coherent) light or may be coherent light such as a laser beam. A super luminescent diode (SLD), amplified spontaneous emission (ASE), a light emitting diode (LED), or the like can be used for the light source 13 that outputs incoherent light.

A solid laser beam source, a semiconductor laser beam source, or the like can be used as the light source 13 that outputs coherent light. The wavelength of light which is emitted from the light source 13 is equal to or greater than 530 nm and preferably equal to or greater than 1064 nm. Light which is output from the light source 13 is guided to a light splitting optical system 14 via a polarization-conserved single-mode optical coupler (not illustrated) and a polarization-conserved single-mode optical coupler for probe light.

The light splitting optical system 14 includes, for example, a polarization beam splitter (PBS) and a λ/4 wavelength plate. The light splitting optical system 14 guides light from the light source 13 to an irradiation optical system including an optical scanner (a scanning unit) 15 and an objective lens 16 and guides light reflected by the semiconductor device D to an optical detector 22. A half mirror may be used as the light splitting optical system 14.

The optical scanner 15 scans irradiation spots on the semiconductor device D. More specifically, the optical scanner 15 scans irradiation spots under the control of a computer 24 which will be described later. The optical scanner 15 includes, for example, an optical scanning element such as a galvanometer mirror, a micro electro-mechanical system (MEMS) mirror, or a polygon mirror.

The objective lens 16 focuses light guided by the optical scanner 15 on the semiconductor device D. The objective lens 16 is configured to switch between a low-magnification objective lens and a high-magnification objective lens by a turret (not illustrated) or the like. The magnification of the low-magnification objective lens is, for example, ×5 and the magnification of the high-magnification objective lens is, for example, ×50. An objective lens driving unit 17 is connected to the objective lens 16. By causing the objective lens driving unit 17 to move in an optical axis direction OD of light from the light source 13, a focal position of the objective lens 16 can be adjusted.

The optical detector 22 detects reflected light from the semiconductor device D and outputs a detection signal in response to light applied thereto. The optical detector 22 is, for example, a photo diode, an avalanche photo diode, a photomultiplier tube, or an area image sensor. The optical detector 22 includes at least one detector and detects the intensity (change in intensity) of light input to the detector.

An amplifier 23 amplifies the detection signal output from the optical detector 22 and outputs the amplified detection signal. The amplified detection signal is input to an image processing unit 30. A reference signal which is generated based on a modulated current signal is also input to the image processing unit 30. The image processing unit 30 generates an in-phase image and an quadrature image based on the detection signal and the reference signal. The image processing unit 30 performs a filtering process on at least one of the in-phase image and the quadrature image and then generates an amplitude image based on the in-phase image and the quadrature image.

The image processing unit 30 includes a frequency analyzing unit (an analysis unit) 12 and a computer (a calculation unit) 24. A lock-in amplifier, a spectrum analyzer, a digitizer, a cross domain analyzer (registered trademark), a network analyzer, a digitizer, or the like is used as the frequency analyzing unit 12. The frequency analyzing unit 12 extracts a measurement frequency component from the amplified detection signal. The measurement frequency is set, for example, based on a modulation frequency of the modulated current signal applied to the semiconductor device D. The frequency analyzing unit 12 acquires the reference signal which has the same period as the modulated current signal applied to the semiconductor device D. The reference signal is output, for example, from the tester unit 11 and is input to the frequency analyzing unit 12.

The frequency analyzing unit 12 outputs amplitude information based on the detection signal to the computer 24. The amplitude information may be, for example, the signal intensity of the detection signal. The frequency analyzing unit 12 outputs phase information based on the detection signal and the reference signal to the computer 24. The phase information is information indicating a phase of the detection signal and may be, for example, a phase difference between the reference signal and the detection signal.

The computer 24 is, for example, a PC. An input device 26 such as a keyboard or a mouse to which measurement conditions or the like are input from a user and a display device 25 such as a display that displays measurement results or the like to the user are connected to the computer 24. The computer 24 includes a central processing unit (CPU) which is a processor, a random access memory (RAM) or a read only memory (ROM) which is a recording medium, and an input and output module. The computer 24 is electrically coupled to the light source 13, the optical scanner 15, the objective lens driving unit 17, the tester unit 11, the optical detector 22, and the frequency analyzing unit 12 via the input and output module and performs a function of controlling them using the CPU. The computer 24 may be a cloud computer, a smart device, a microcomputer, or a field-programmable gate array (FPGA).

Figure 2:
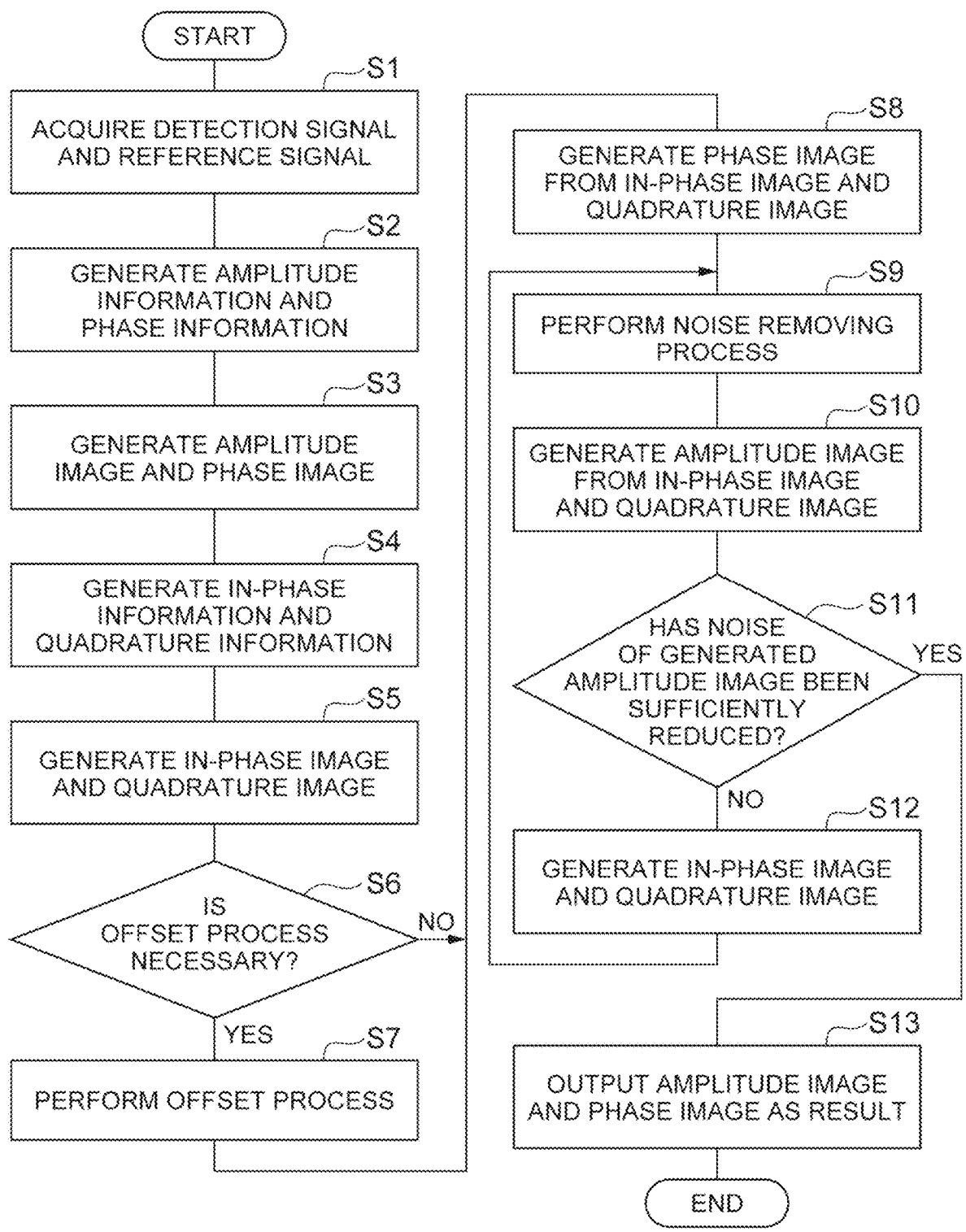
FIG. 2 is a flowchart illustrating a semiconductor device inspection method which is performed by the semiconductor device inspection apparatus.

A process routine which is performed by the image processing unit 30 (the frequency analyzing unit 12 and the computer 24) in a semiconductor device inspection method according to this embodiment will be described below with reference to FIG. 2. In this embodiment, the semiconductor device D is irradiated with light from the light source 13 in a state in which a predetermined modulated current signal is input to the semiconductor device D which is an inspection object. As described above, reflected light from the semiconductor device D is converted into a detection signal by the optical detector 22 and the amplifier 23 and is input to the image processing unit 30. As illustrated in FIG. 2, in the image processing unit 30, the frequency analyzing unit 12 acquires the detection signal and a reference signal (Step S1). The frequency analyzing unit 12 generates amplitude information and phase information in the detection signal based on the acquired detection signal and the acquired reference signal (Step S2). The generated amplitude information and the generated phase information are output to the computer 24.

Figure 3:
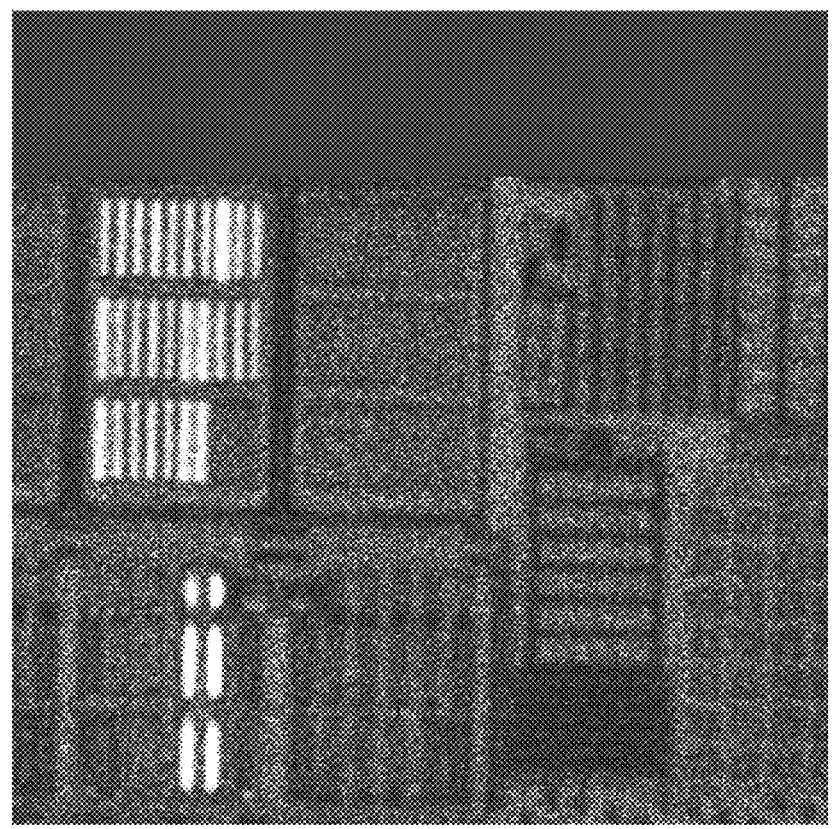
FIG. 3 is a diagram illustrating an example of an amplitude image.
Figure 4:
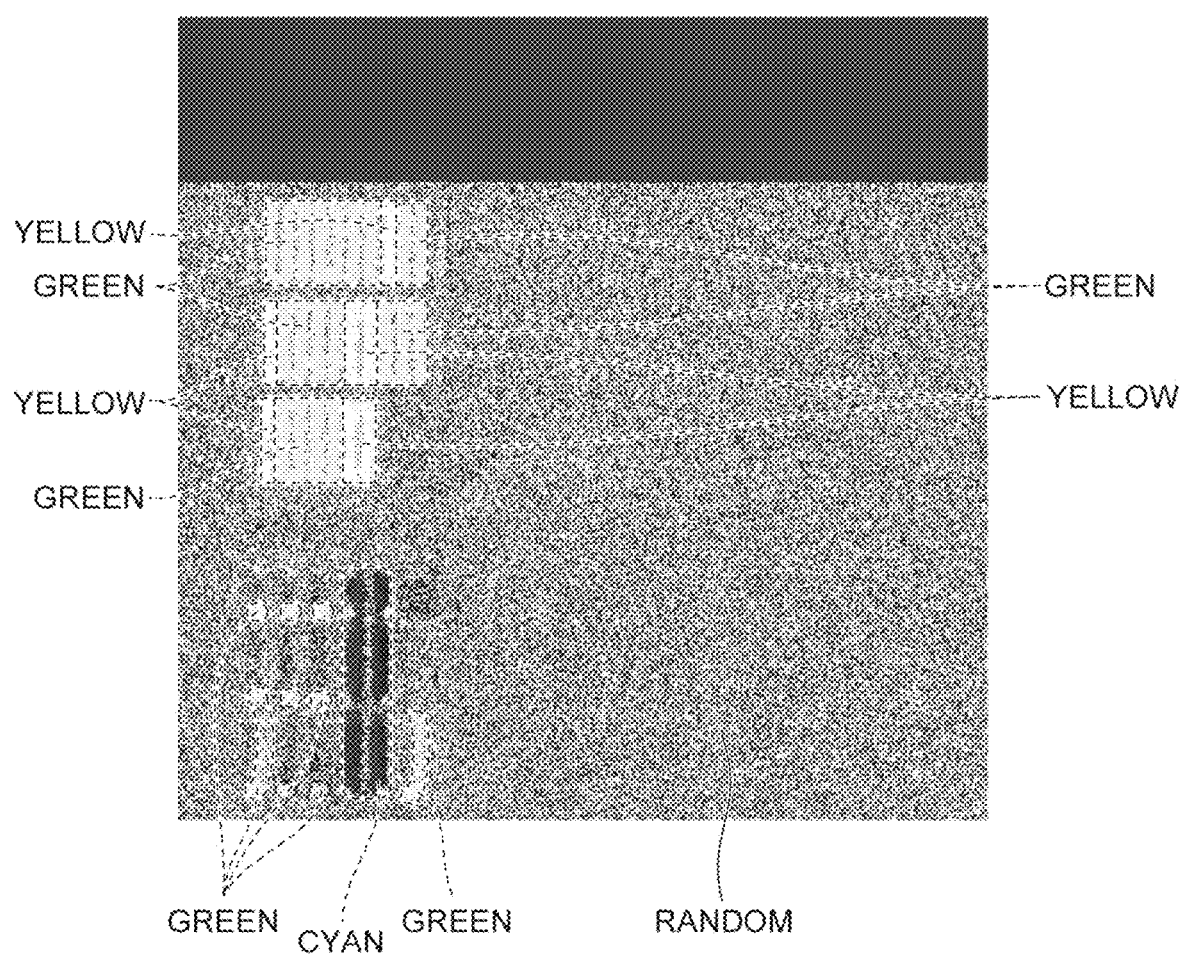
FIG. 4 is a diagram illustrating an example of a phase image.

Subsequently, the computer 24 generates an amplitude image and a phase image based on the acquired amplitude information and the acquired phase information (Step S3). The amplitude image and the phase image are images which are correlated with the amplitude information and the phase information for each irradiation spot (pixel) scanned by the optical scanner 15. For example, the amplitude image is an image in which the signal intensity of a detection signal in each irradiation spot is mapped on a predetermined luminance value corresponding to the signal intensity. For example, as illustrated in FIG. 3, the amplitude image is drawn closer to white as signal intensity becomes larger and is drawn closer to black as the signal intensity becomes smaller. The phase image is an image in which a phase difference is mapped on a predetermined color corresponding to the phase difference. In correspondence between a phase difference and a color, "red" is allocated to a range of a phase difference of $-\pi/4$ to $\pi/4$. "Yellow" is allocated to a range of a phase difference of $\pi/4$ to $3\pi/4$. "Green" is allocated to a range of a phase difference of $3\pi/4$ to $\pi$ and a range of a phase difference of $-3\pi/4$ to $-\pi$. "Cyan" is allocated to a range of a phase difference of $-3\pi/4$ to $-\pi/4$. For example, as illustrated in FIG. 4, the same color appears collectively in a range in which a reaction is output in response to an input of a modulated current signal. Random colors appear in a range in which a reaction is not output in response to an input of a modulated current signal.

Subsequently, the computer 24 generates in-phase information and quadrature information in the amplitude image based on the amplitude image and the phase image (Step S4). The in-phase information indicates an in-phase component at a frequency to be measured and the quadrature information indicates an quadrature component at a frequency to be measured. For example, each pixel constituting an irradiation spot is defined as (i, j), a value of each pixel in the amplitude image is defined as $A_{ij}$, and a value of each pixel in the phase image is defined as $\theta_{ij}$. In this case, when the in-phase information in each pixel is defined as $I_{ij}$ and the quadrature information in each pixel is defined as $Q_{ij}$, $I_{ij}$ and $Q_{ij}$ can be expressed by the following equations.

$$I_{ij} = A_{ij}\cos(\theta_{ij}) \quad (1)$$

$$Q_{ij} = A_{ij}\sin(\theta_{ij}) \quad (2)$$

Figure 5:
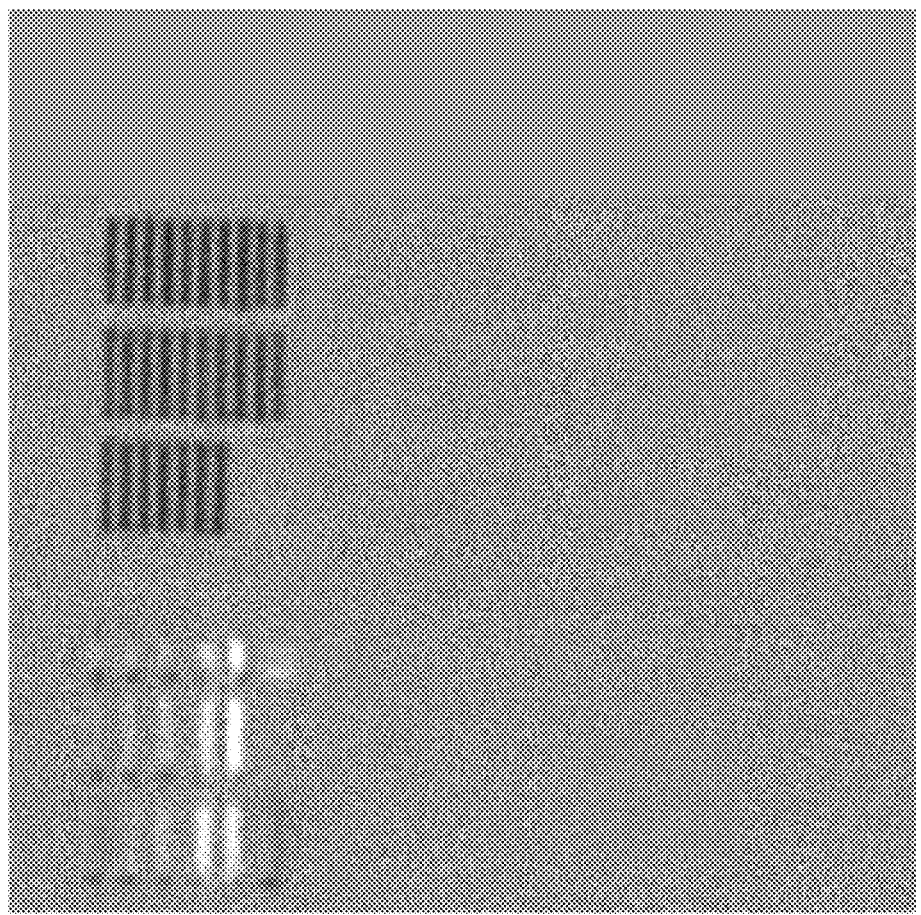
FIG. 5 is a diagram illustrating an example of an in-phase image.
Figure 6:
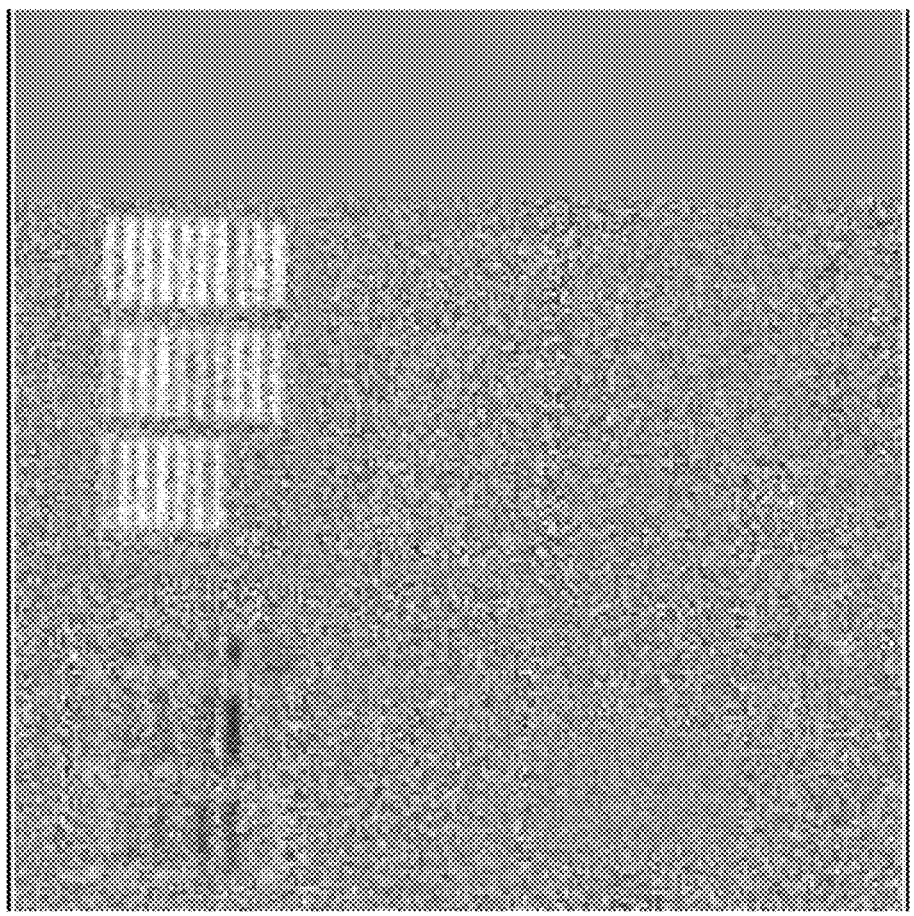
FIG. 6 is a diagram illustrating an example of an quadrature image.

The computer 24 generates an in-phase image (a first in-phase image) and an quadrature image (a first quadrature image) based on the in-phase information and the quadrature information which have been generated in this way (Step S5). Accordingly, the in-phase image and the quadrature image include the amplitude information and the phase information in the detection signal. The in-phase image is an image in which the in-phase information in each pixel is mapped on a predetermined luminance value corresponding to the in-phase information. The quadrature image is an image in which the quadrature information in each pixel is mapped on a predetermined luminance value corresponding to the quadrature information. For example, as illustrated in FIGS. 5 and 6, the in-phase image and the quadrature image are drawn closer to white or black as the absolute value of the information becomes larger.

Subsequently, it is determined whether it is necessary to perform an offset process on the phase image and the quadrature image (Step S6). As described above, in the in-phase image, the same color appears collectively in the range in which a reaction is output in response to an input of a signal and random colors appear in a range in which a signal is not input. That is, the phase information has a random value in an area without any signal. In the trigonometric functions in Equations (1) and (2) for deriving the in-phase information and the quadrature information, an average value over all phases becomes zero. Accordingly, in the in-phase image and the quadrature image, an average value in a background area originally without any signal is ideally zero.

In Step S6, average values in the background areas of the in-phase image and the quadrature image are calculated and it is determined whether it is necessary to perform an offset process thereon. A background area is an area in which a modulated current signal does not flow in the semiconductor device D, and the range is designated automatically or manually. In a state in which a modulated current signal is not input to the semiconductor device D, all the area of the semiconductor device D can be the background area. Accordingly, an in-phase image and an quadrature image which are acquired without inputting a modulated current signal to the semiconductor device D may be used as the background area. In this embodiment, for example, when the absolute values of the average values in the background areas of the in-phase image and the quadrature image are greater than a predetermined threshold value, the offset process is performed (Step S7). In the offset process, all the in-phase image and the quadrature image are caused to be offset such that the average values in the background areas of the in-phase image and the quadrature image are zero.

Subsequently, the computer 24 generates a phase image based on the in-phase image and the quadrature image which have been subjected to the offset process in Step S7 (Step S8). When the value of the in-phase image subjected to the offset process is defined as $I'_{ij}$ and the value of the quadrature image subjected to the offset process is defined as $Q'_{ij}$, the phase image $\theta'_{ij}$ which is generated based on the in-phase image and the quadrature image subjected to the offset process is expressed by Equations (3) and (4). When it is determined in Step S6 that it is not necessary to perform the offset process, the phase image generated in Step S3 may be used as the phase image in that state.

$$\theta'_{ij} = \arctan(Q'_{ij}/I'_{ij}) \quad (3)$$

Here, $I'_{ij} > 0$ is satisfied.

$$\theta'_{ij} = -\arctan(Q'_{ij}/I'_{ij}) \quad (4)$$

here, $I'_{ij} < 0$ is satisfied.

Subsequently, the computer 24 performs a noise removing process (a filtering process) of reducing noise on at least one of the in-phase image and the quadrature image subjected to the offset process in Step S7 (Step S9). In this embodiment, a filtering process of reducing noise is performed on both the in-phase image and the quadrature image subjected to the offset process. A filter which is used for the noise removing process may be any filter for removing noise and is, for example, a nonlinear filter, a spatial filter, or a probability-statistics filter. More specifically, one of a median filter, a smoothing (averaging) filter, a nonlocal averaging filter, and a frequency filter (a low-pass filter) may be used. The filter may be a moving averaging filter, a Gaussian filter, or a wavelet filter.

Figure 7:
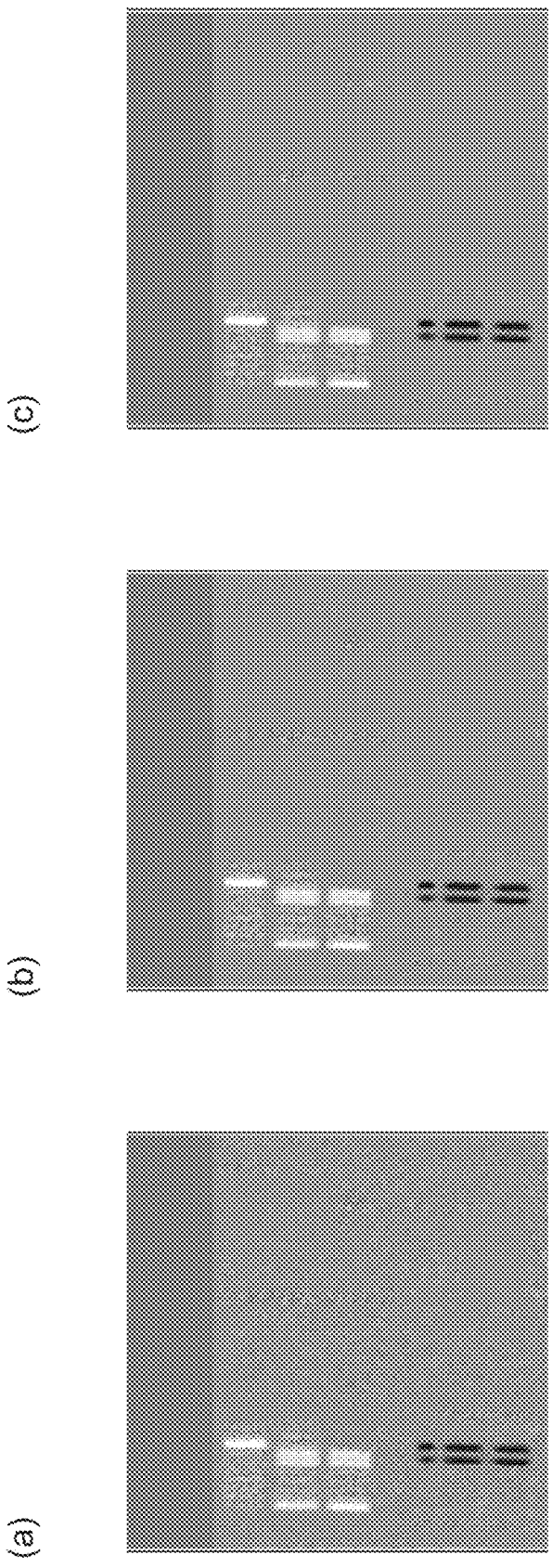
FIG. 7 is a diagram illustrating an example of an in-phase image in which noise has been reduced.

The in-phase image and the quadrature image are a product of an amplitude image and a phase image. Accordingly, in a background area without any signal, the value I' of the phase image and the value Q' of the quadrature image are random. Accordingly, since an expected value in the background area is zero, variance decreases and thus noise in the background area is reduced. When it is determined in Step S6 that it is not necessary to perform the offset process, the noise removing process may be performed on the in-phase image and the quadrature image generated in Step S5. (a) of FIG. 7 illustrates an example in which the noise removing process has been performed one time on the in-phase image illustrated in FIG. 5. (a) of FIG. 8 illustrates an example in which the noise removing process has been performed one time on the quadrature image illustrated in FIG. 6. In the examples illustrated in FIGS. 7 and 8, the offset process in Step S6 is performed. As illustrated in (a) of FIG. 7 and (a) of FIG. 8, the background areas in the in-phase image and the quadrature image are more uniform than those before the process is performed by performing the noise removing process.

Subsequently, the computer 24 generates an amplitude image (a first amplitude image) based on the in-phase image and the quadrature image subjected to the noise removing process in Step S9. Since noise of the in-phase image and the quadrature image is reduced, it is possible to acquire an amplitude image with reduced noise. When the in-phase image subjected to the noise removing process is defined as I'(1) and the quadrature image subjected to the noise removing process is defined as Q'(1), the generated amplitude image $A'(1)_{ij}$ is expressed by Equation (5). (a) of FIG. 9 and (a) of FIG. 10 illustrate amplitude images which are generated based on an in-phase image illustrated in (a) of FIG. 7 and the quadrature image illustrated in (a) of FIG. 8. As illustrated in (a) of FIG. 9, in the amplitude image subjected to the noise removing process, particularly the background area is blackish. In FIG. 10, an enhancement process is performed in the amplitude image illustrated in FIG. 9. It can be seen that noise of the background area remains still in the image subjected to the enhancement process.

[Math. 1]

$$A'(1)_{ij} = \sqrt{(I'(1)^2 + Q'(1)^2)} \quad (5)$$

Subsequently, the computer 24 determines whether noise in the amplitude image generated in Step S10 has been sufficiently reduced (Step S11). For example, when an SN ratio of the amplitude image generated in Step S10 is improved at a predetermined ratio by about ten times than the SN ratio of the previous amplitude image, it may be determined that noise has been sufficiently reduced. In this case, the amplitude image with reduced noise is output as a measurement result to the display device 25 (Step S13). In Step S13, the phase image generated in Step S8 along with the amplitude image may be output to the display device 25. In Step S11, the amplitude image generated in Step S10 may be checked by a user. In this case, the user may determine whether noise has been sufficiently reduced.

On the other hand, when it is determined in Step S11 that noise has not been sufficiently reduced, the computer 24 generates an in-phase image (a second in-phase image) and an quadrature image (a second quadrature image) based on the amplitude image generated in Step S10 and the phase image generated in Step S8 (Step S12). Then, by repeatedly performing the processes of Step S9 and steps subsequent thereto, an amplitude image (a second amplitude image) in which noise has been sufficiently reduced can be obtained finally. (b) of FIG. 7 illustrates an example in which the noise removing process has been performed two times on the in-phase image illustrated in FIG. 5 and (c) of FIG. 7 illustrates an example in which the noise removing process has been performed three times on the in-phase image illustrated in FIG. 5. (b) of FIG. 8 illustrates an example in which the noise removing process has been performed two times on the quadrature image illustrated in FIG. 6 and (c) of FIG. 8 illustrates an example in which the noise removing process has been performed three times on the quadrature image illustrated in FIG. 6. As illustrated in FIGS. 7 and 8, by repeatedly performing the noise removing process, the background area becomes more uniform and the image becomes closer to a monochromatic color. Accordingly, a boundary between the background area and an area in which a signal is detected can be clearly visible.

(b) of FIG. 9 and (b) of FIG. 10 illustrate amplitude images which are generated based on the in-phase image illustrated in (b) of FIG. 7 and the quadrature image illustrated in (b) of FIG. 8. (c) of FIG. 9 and (c) of FIG. 10 illustrate amplitude images which are generated based on the in-phase image illustrated in (c) of FIG. 7 and the quadrature image illustrated in (c) of FIG. 8. As illustrated in FIGS. 9 and 10, it can be seen that noise in the background area is reduced by repeatedly performing the noise removing process. Particularly, in the image subjected to the enhancement process and illustrated in FIG. 10, most floating line shapes in the background area in (a) of FIG. 10 are not visually recognized in (c) of FIG. 10.

In the semiconductor device inspection apparatus 1, the image processing unit 30 generates a first amplitude image based on a first in-phase image and a first quadrature image including amplitude information and phase information of a detection signal. The phase information in the background area in which a reaction in response to a stimulation signal cannot be acquired indicates a random value. In the background area, the first in-phase image and the first quadrature image including the phase information also have a random value. Accordingly, by performing a filtering process on at least one of the first in-phase image and the first quadrature image, the first amplitude image in which noise has been effectively reduced is acquired. In normal measurement, noise due to shot noise remains even in the background area without any signal and visibility of a signal is low in the amplitude image. In this embodiment, since noise in the background area can be approximated to zero in principle, it is possible to improve the S/N ratio. Accordingly, it is possible to accurately perform inspection of a semiconductor device D.

In the aspect, the image processing unit 30 may generate a phase image based on the first in-phase image and the first quadrature image, generate a second in-phase image and a second quadrature image based on the first amplitude image and the phase image, perform a filtering process on at least one of the second in-phase image and the second quadrature image, and then generate a second amplitude image based on the second in-phase image and the second quadrature image. According to this configuration, a second amplitude image in which noise has been more effectively reduced can be acquired by further performing a filtering process on the first amplitude image which is generated by performing the filtering process thereon.

In the aspect, the image processing unit 30 may cause the first in-phase image and the first quadrature image to be offset such that the average value of the signal intensities in the background area in which a detection signal was not originally detected is 0 and perform the filtering process on at least one of the first in-phase image and the first quadrature image which have been offset. A reference signal is input from the tester unit 11 to the frequency analyzing unit 12 of the image processing unit 30. Accordingly, there is concern that noise based on the reference signal will be generated due to a cross-talk or the like. By causing the first in-phase image and the first quadrature image to be offset such that the average value of the signal intensities in the background area is zero, it is possible to generate an amplitude image in which noise has been reduced.

In the aspect, the image processing unit 30 may generate a phase image based on the first in-phase image and the first quadrature image which have been offset. According to this configuration, it is possible to generate a phase image in which a noise component based on the reference signal has been reduced.

In the aspect, since the analysis unit is constituted by one of a lock-in amplifier, a spectrum analyzer, and a network analyzer, it is possible to easily implement the analysis unit.

Second Embodiment

A semiconductor device inspection apparatus 101 according to this embodiment is different from the semiconductor device inspection apparatus 1 according to the first embodiment in that a magneto-optical crystal disposed to face the semiconductor device D in an optical path of light is provided. Hereinafter, differences from the first embodiment will be mainly described, the same elements or members will be referred to by the same reference signals, and detailed description thereof will not be repeated.

Figure 11:
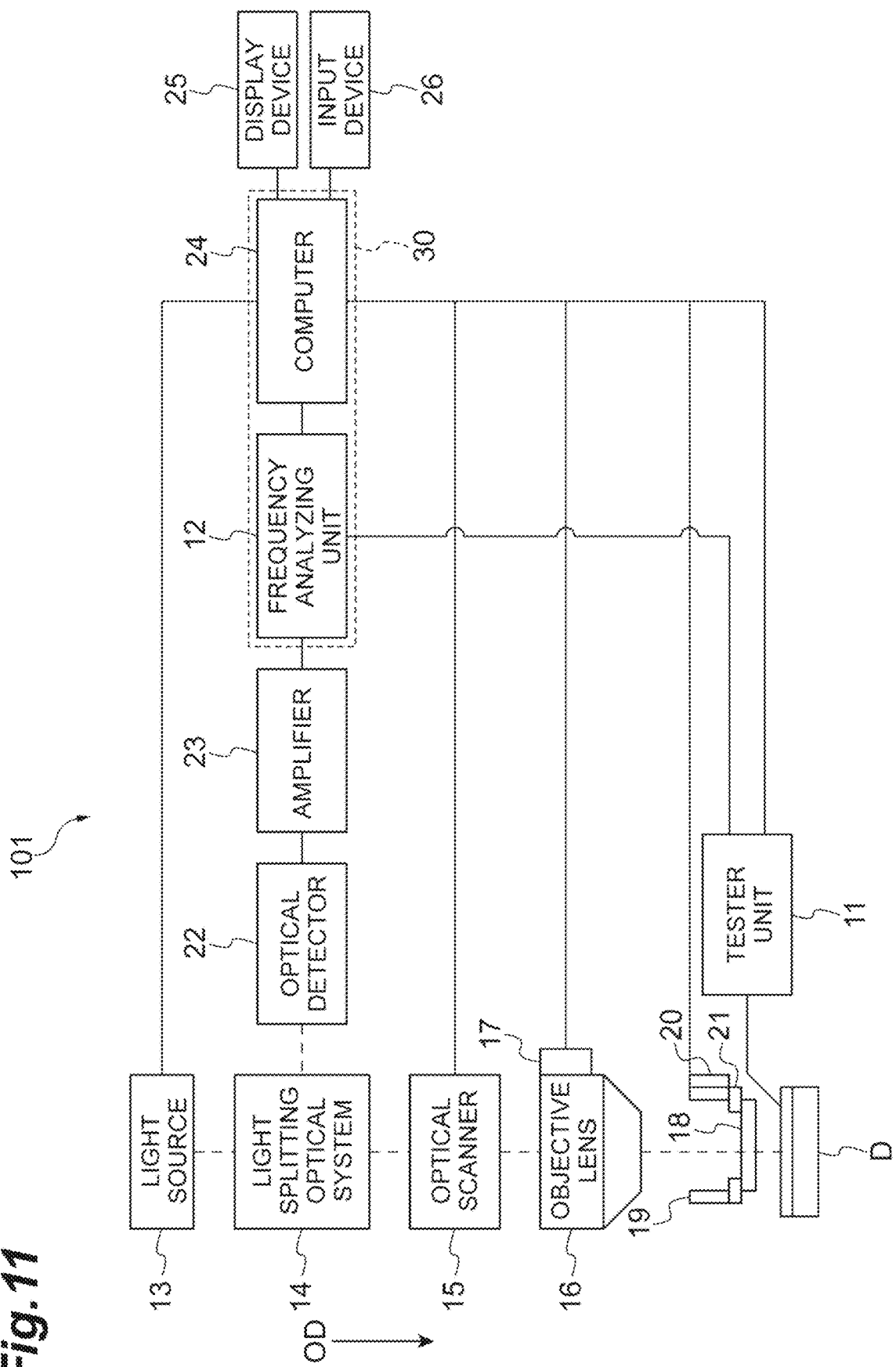
FIG. 11 is a diagram illustrating a configuration of an inspection apparatus according to a second embodiment.

As illustrated in FIG. 11, the semiconductor device inspection apparatus 101 is a magneto-optical frequency mapping (MOFM) device including a magneto-optical (MO) crystal 18. The MO crystal 18 is disposed to face a semiconductor device D. A refractive index of the MO crystal 18 changes depending on a magnetic field generated in the semiconductor device D due to a magneto-optical effect and the MO crystal changes a polarization state (a polarization direction) of incident light. For example, when the semiconductor device D malfunctions or the like and a modulate current signal is applied to the semiconductor device D, a current path in which a leakage current flows depending on a position of a fault may be generated. In this case, at the position in which the leakage current has been generated, a magnetic field different from that at a position at which a leakage current has not been generated. The MO crystal 18 outputs reflected light of which the polarization direction has changed depending on change of the magnetic field. Reflected light from the MO crystal 18 is returned to the light splitting optical system 14 via the objective lens 16 and the optical scanner 15 and is guided to the optical detector 22 via an optical fiber for feedback.

A holder 19 that holds the MO crystal 18 is coupled to the MO crystal 18 via a flexible member 21. The flexible member 21 is a ring-shaped elastic member including, for example, a rubber or a spring. The holder 19 has, for example, a ring shape. The holder 19 is fixed to the flexible member 21 to cover an outer edge of the flexible member 21 when seen in the optical axis direction OD. A holder driving unit 20 is coupled to the holder 19. The holder driving unit 20 moves the holder 19 in the optical axis direction OD by moving in the optical axis direction OD. When the holder driving unit 20 moves in the optical axis direction OD, a distance between the holder 19 and the semiconductor device D decreases and the MO crystal 18 is pressed against the semiconductor device D. Irradiation of the MO crystal 18 with light may be performed in a state in which the MO crystal 18 is in contact with the semiconductor device D. A polarization plane of reflected light from the MO crystal 18 rotates due to a magneto-optical effect (such as a Kerr effect or a Faraday effect) which is proportional to a magnetic field (magnetic field intensity) generated due to a modulated current signal applied to the semiconductor device D. The polarization plane of the reflected light is inclined by 22.5 degrees by a Faraday rotator added to the light splitting optical system 14 and the reflected light is input to the optical detector 22.

In the semiconductor device inspection apparatus 101, a position at which an abnormality has occurred can be specified by a magneto-optical probing technique. In this embodiment, the same operational advantages as in the first embodiment are achieved.

While embodiments have been described above in detail with reference to the drawings, the specific configuration is not limited to the embodiments.

For example, in the embodiments, the frequency analyzing unit 12 outputs the amplitude information and the phase information generated in Step S2 to the computer 24, but the present disclosure is not limited thereto. In this example, the processing load in the frequency analyzing unit 12 is decreased. For example, the frequency analyzing unit 12 may output in-phase information and quadrature information which are generated based on the reference signal and the detection signal to the computer 24 instead of the amplitude information and the phase information. In this case, since the computer 24 takes charge of the processes of Step S5 and steps subsequent thereto, the processing load in the computer 24 is decreased.

In the embodiments, the present disclosure is applied to an EOFM device and an MOFM device, but the present disclosure may be applied to calorific measurement, optical beam induced resistance change (OBIRCH) measurement, optical beam induced current (OBIC) measurement, and the like to which a lock-in measurement technique can be applied.

REFERENCE SIGNS LIST 1, 101 Semiconductor device inspection apparatus
12 Frequency analyzing unit (analysis unit)

13 Light source
15 Optical scanner (scanning unit)
18 MO crystal (magneto-optical crystal)
22 Optical detector
24 Computer (calculation unit)
30 Image processing unit
D Semiconductor device (inspection object)

The invention claimed is:

1. A method for inspecting a semiconductor device, the method comprising:
   inputting a stimulation signal to the semiconductor device;
   acquiring a detection signal based on a reaction of the semiconductor device to which the stimulation signal has been input;
   generating a first in-phase image and a first quadrature image including amplitude information and phase information in the detection signal based on the detection signal and a reference signal generated based on the stimulation signal;
   performing a filtering process of reducing noise on at least one of the first in-phase image and the first quadrature image and then generating a first amplitude image based on the first in-phase image and the first quadrature image;
   generating a phase image based on the first in-phase image and the first quadrature image;
   generating a second in-phase image and a second quadrature image based on the first amplitude image and the phase image; and
   performing a filtering process of reducing noise on at least one of the second in-phase image and the second quadrature image and then generating a second amplitude image based on the second in-phase image and the second quadrature image.

2. The method according to claim 1, further comprising causing the first in-phase image and the first quadrature image to be offset such that an average value of signal intensities of the first in-phase image and the first quadrature image in a background area in which the detection signal was not originally detected is 0,
   wherein generating the first amplitude image includes performing the filtering process on at least one of the first in-phase image and the first quadrature image which have been offset.

3. The method according to claim 1, further comprising:
   causing the first in-phase image and the first quadrature image to be offset such that an average value of signal intensities of the first in-phase image and the first quadrature image in a background area in which the detection signal was not originally detected is 0;
   generating a phase image based on the first in-phase image and the first quadrature image which have been offset;
   generating a second in-phase image and a second quadrature image based on the first amplitude image and the phase image; and
   performing a filtering process of reducing noise on at least one of the second in-phase image and the second quadrature image and then generating a second amplitude image based on the second in-phase image and the second quadrature image.

4. The method according to claim 1, wherein a filter which is used in the filtering process is one of a median filter, a nonlocal averaging filter, and a frequency filter.

5. An apparatus for inspecting a semiconductor device in a state in which a stimulation signal has been input to the semiconductor device, the apparatus comprising:
   a detector configured to detect a reaction of the semiconductor device to which the stimulation signal has been input and outputs a detection signal; and
   an image processor configured to generate a first in-phase image and a first quadrature image including amplitude information and phase information in the detection signal based on the detection signal and a reference signal generated based on the stimulation signal, performs a filtering process of reducing noise on at least one of the first in-phase image and the first quadrature image, and then generates a first amplitude image based on the first in-phase image and the first quadrature image, wherein the image processor generates a phase image based on the first in-phase image and the first quadrature image, generates a second in-phase image and a second quadrature image based on the first amplitude image and the phase image, performs a filtering process on at least one of the second in-phase image and the second quadrature image, and then generates a second amplitude image based on the second in-phase image and the second quadrature image.

6. The apparatus according to claim 5, wherein the image processor causes the first in-phase image and the first quadrature image to be offset such that an average value of signal intensities in a background area in which the detection signal was not originally detected is 0 and performs the filtering process on at least one of the first in-phase image and the first quadrature image which have been offset.

7. The apparatus according to claim 5, wherein the image processor causes the first in-phase image and the first quadrature image to be offset such that an average value of signal intensities in a background area in which the detection signal was not originally detected is 0 and generates a phase image based on the first in-phase image and the first quadrature image which have been offset.

8. The apparatus according to claim 5, wherein a filter which is used in the filtering process is one of a median filter, a nonlocal averaging filter, and a frequency filter.

9. The apparatus according to claim 5, wherein the image processor includes an analyzer configured to generate in-phase information and quadrature information based on the detection signal and the reference signal and a calculator configured to generate the first in-phase image and the first quadrature image based on the in-phase information and the quadrature information.

10. The apparatus according to claim 5, wherein the image processor includes an analyzer configured to generate the amplitude information and the phase information based on the detection signal and the reference signal and a calculator configured to generate the first in-phase image and the first quadrature image based on the amplitude information and the phase information.

11. The apparatus according to claim 9, wherein the analyzer is one of a lock-in amplifier, a spectrum analyzer, and a network analyzer.

12. The apparatus according to claim 5, further comprising:
   a light source for irradiating the semiconductor device with light; and
   a scanner configured to scan the semiconductor device with the light, wherein the detector detects change in intensity of reflected light of the light as a reaction of the semiconductor device to which the stimulation signal has been input.

13. The apparatus according to claim 12, further comprising a magneto-optical crystal disposed to face the semiconductor device in an optical path of the light.

14. A method for inspecting a semiconductor device, the method comprising:
inputting a stimulation signal to the semiconductor device;
acquiring a detection signal based on a reaction of the semiconductor device to which the stimulation signal has been input;
generating a first in-phase image and a first quadrature image including amplitude information and phase information in the detection signal based on the detection signal and a reference signal generated based on the stimulation signal;
performing a filtering process of reducing noise on at least one of the first in-phase image and the first quadrature image and then generating a first amplitude image based on the first in-phase image and the first quadrature image; and
causing the first in-phase image and the first quadrature image to be offset such that an average value of signal intensities of the first in-phase image and the first quadrature image in a background area in which the detection signal was not originally detected is 0,
wherein generating the first amplitude image includes performing the filtering process on at least one of the first in-phase image and the first quadrature image which have been offset.

15. A method for inspecting a semiconductor device, the method comprising:
inputting a stimulation signal to the semiconductor device;
acquiring a detection signal based on a reaction of the semiconductor device to which the stimulation signal has been input;
generating a first in-phase image and a first quadrature image including amplitude information and phase information in the detection signal based on the detection signal and a reference signal generated based on the stimulation signal;
performing a filtering process of reducing noise on at least one of the first in-phase image and the first quadrature image and then generating a first amplitude image based on the first in-phase image and the first quadrature image;
causing the first in-phase image and the first quadrature image to be offset such that an average value of signal intensities of the first in-phase image and the first quadrature image in a background area in which the detection signal was not originally detected is 0;
generating a phase image based on the first in-phase image and the first quadrature image which have been offset;
generating a second in-phase image and a second quadrature image based on the first amplitude image and the phase image; and
performing a filtering process of reducing noise on at least one of the second in-phase image and the second quadrature image and then generating a second amplitude image based on the second in-phase image and the second quadrature image.

16. An apparatus for inspecting a semiconductor device in a state in which a stimulation signal has been input to the semiconductor device, the apparatus comprising:
a detector configured to detect a reaction of the semiconductor device to which the stimulation signal has been input and outputs a detection signal; and
an image processor configured to generate a first in-phase image and a first quadrature image including amplitude information and phase information in the detection signal based on the detection signal and a reference signal generated based on the stimulation signal, performs a filtering process of reducing noise on at least one of the first in-phase image and the first quadrature image, and then generates a first amplitude image based on the first in-phase image and the first quadrature image, wherein the image processor causes the first in-phase image and the first quadrature image to be offset such that an average value of signal intensities in a background area in which the detection signal was not originally detected is 0 and performs the filtering process on at least one of the first in-phase image and the first quadrature image which have been offset.

17. An apparatus for inspecting a semiconductor device in a state in which a stimulation signal has been input to the semiconductor device, the apparatus comprising:
a detector configured to detect a reaction of the semiconductor device to which the stimulation signal has been input and outputs a detection signal; and
an image processor configured to generate a first in-phase image and a first quadrature image including amplitude information and phase information in the detection signal based on the detection signal and a reference signal generated based on the stimulation signal, performs a filtering process of reducing noise on at least one of the first in-phase image and the first quadrature image, and then generates a first amplitude image based on the first in-phase image and the first quadrature image, wherein the image processor causes the first in-phase image and the first quadrature image to be offset such that an average value of signal intensities in a background area in which the detection signal was not originally detected is 0 and generates a phase image based on the first in-phase image and the first quadrature image which have been offset.

* * * * *